Figure 1A:
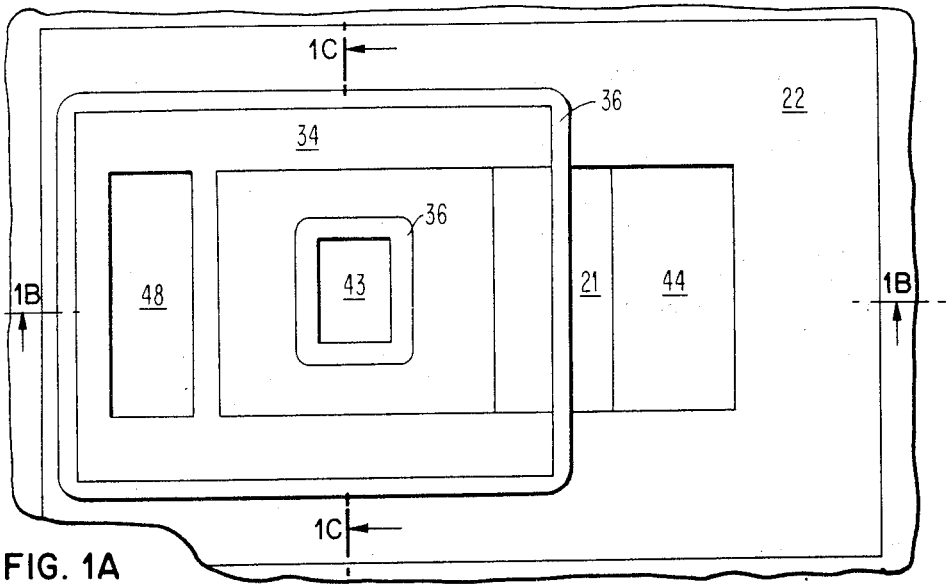
Figure 1B:
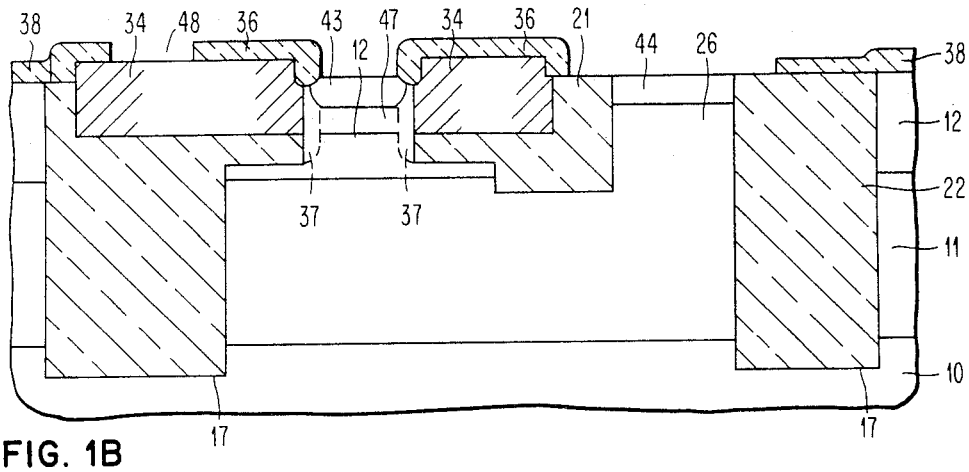
Figure 1C:
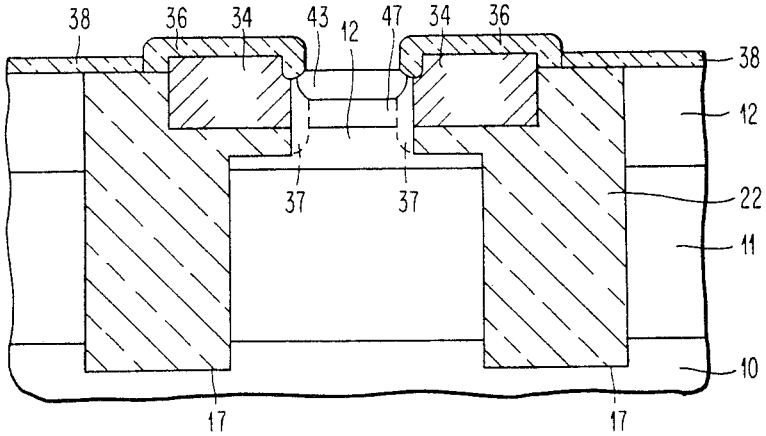
Figure 2:
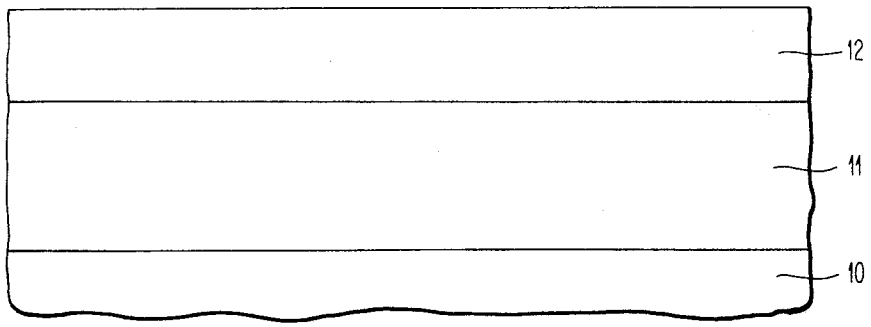
Figure 3:
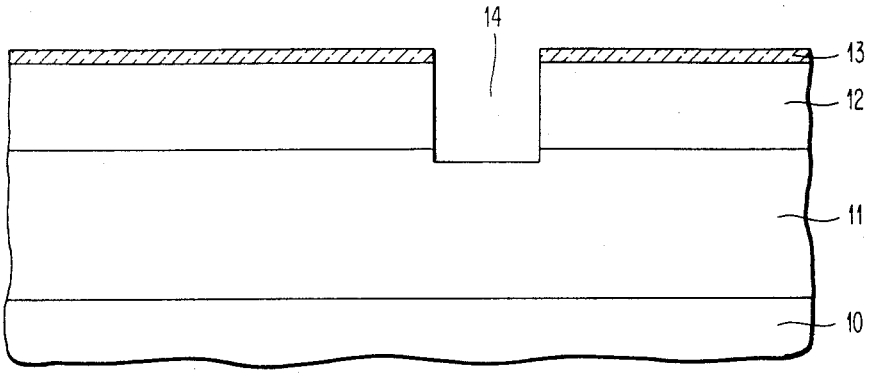
Figure 4:
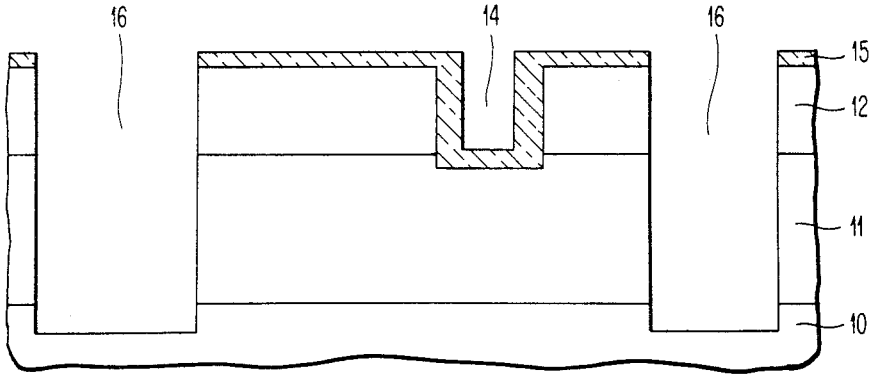
Figure 5:
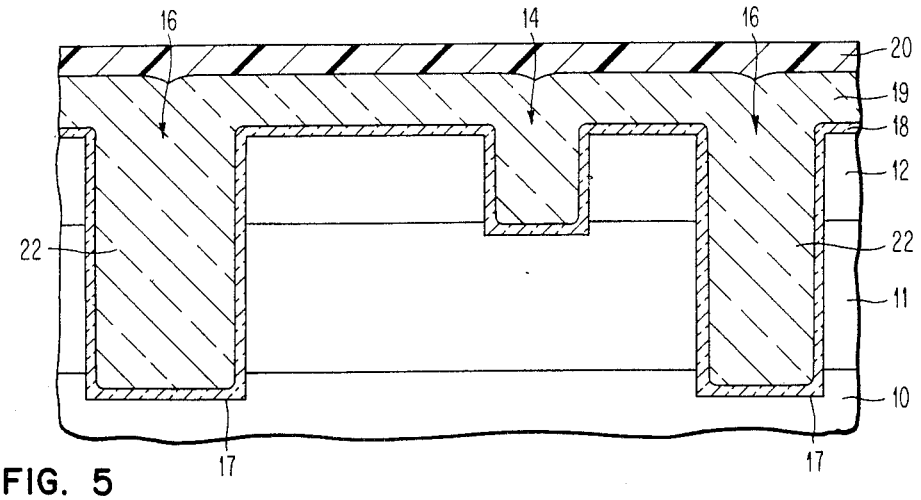
Figure 6:
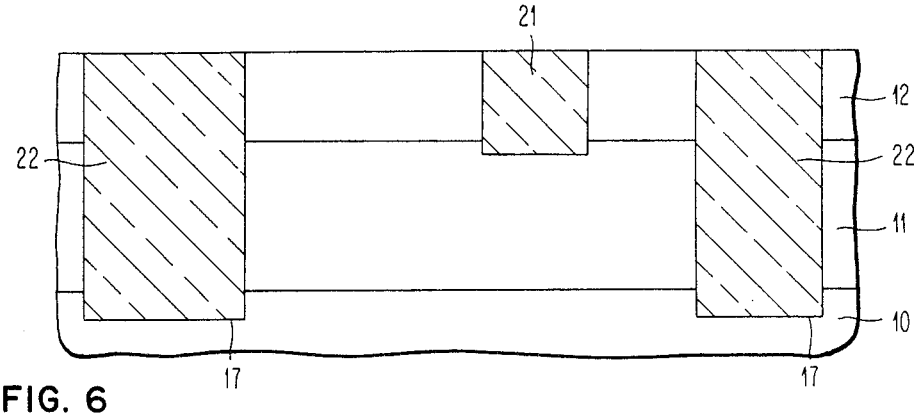
Figure 7:
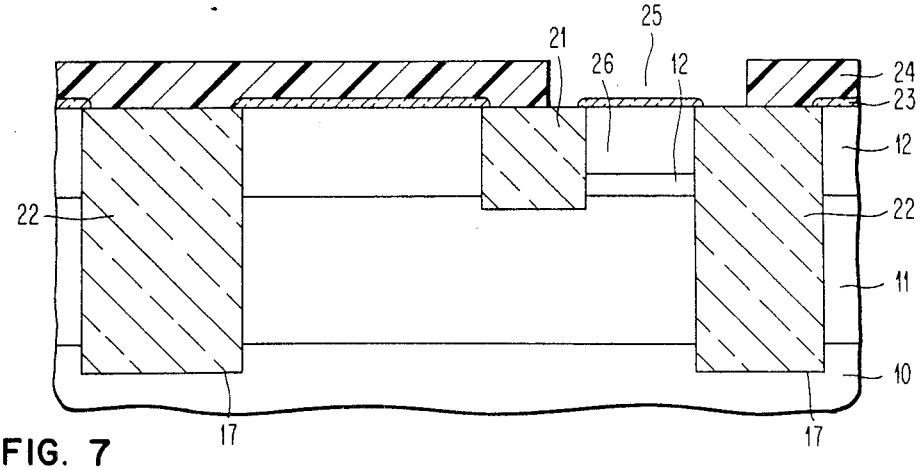
Figure 7A:
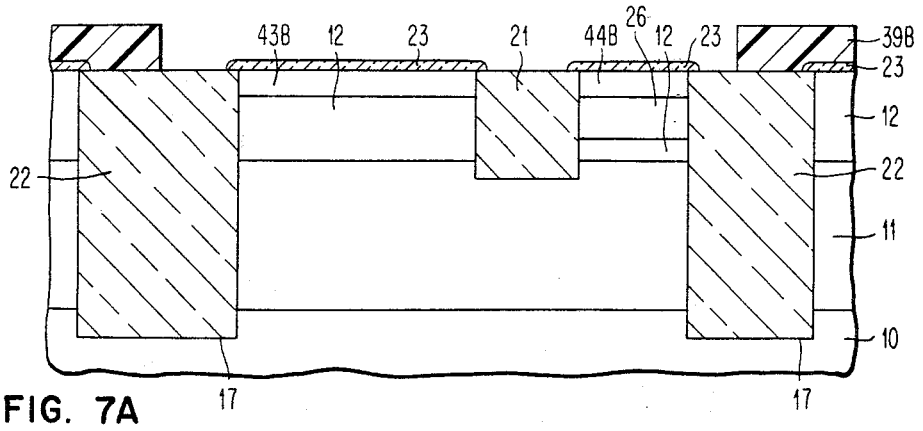
Figure 9A:
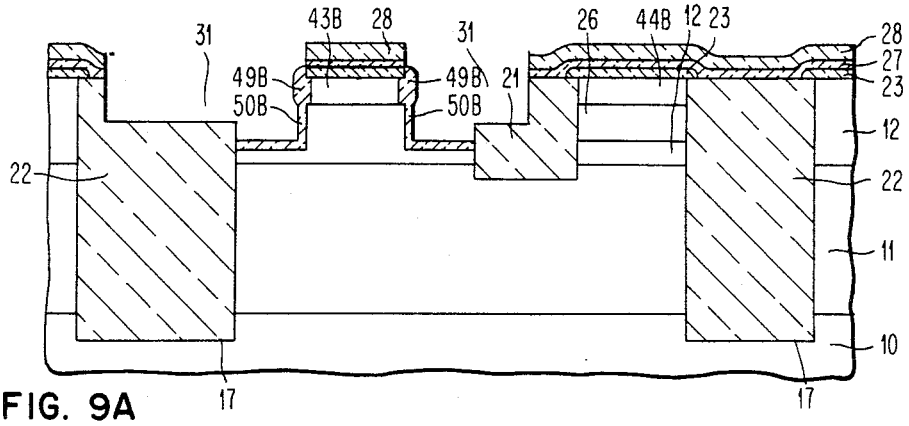
Figure 11A:
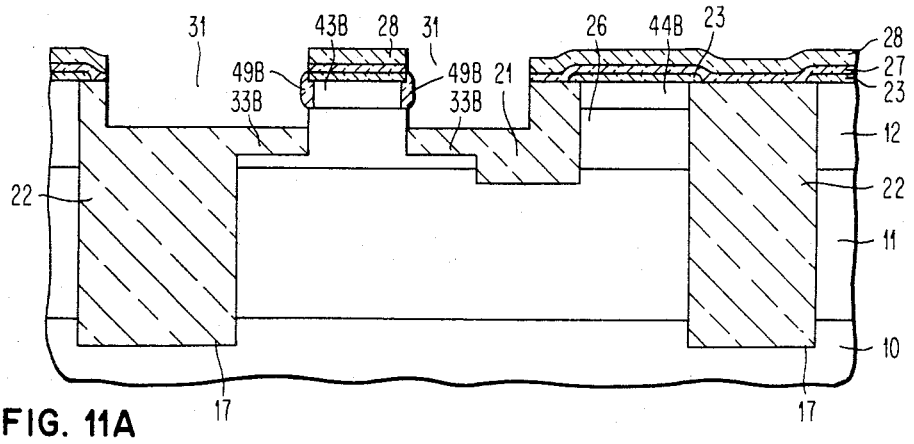
Figure 8:
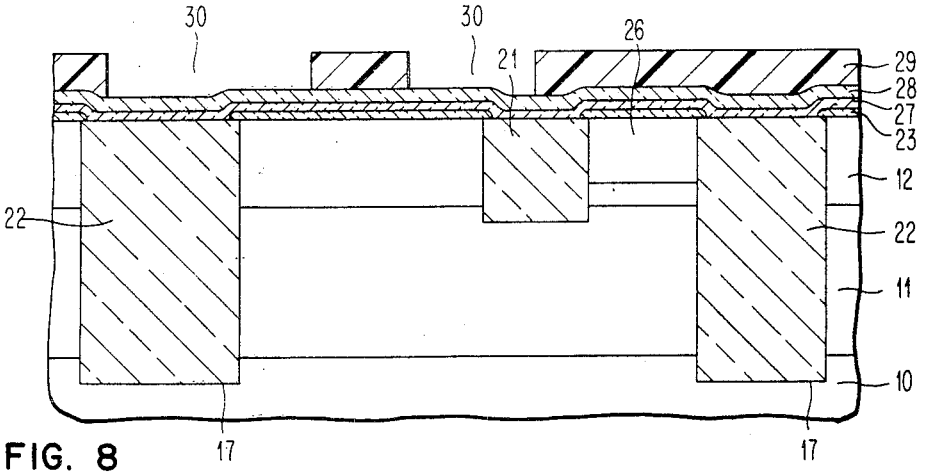
Figure 9:
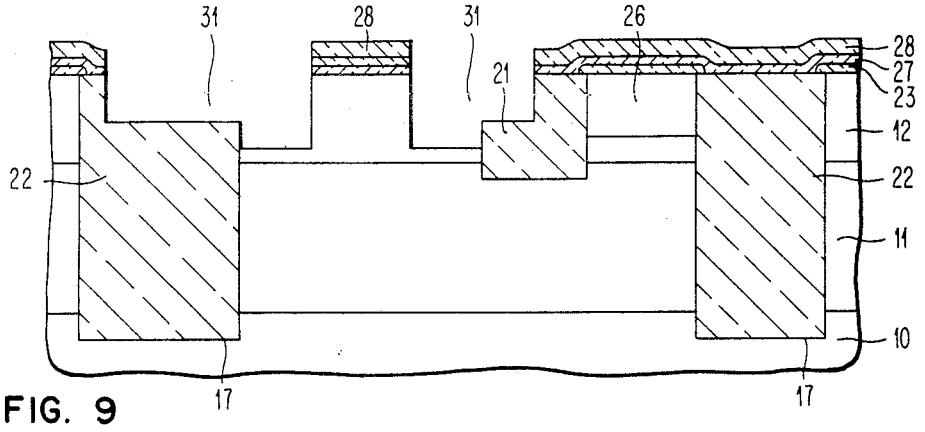
Figure 10:
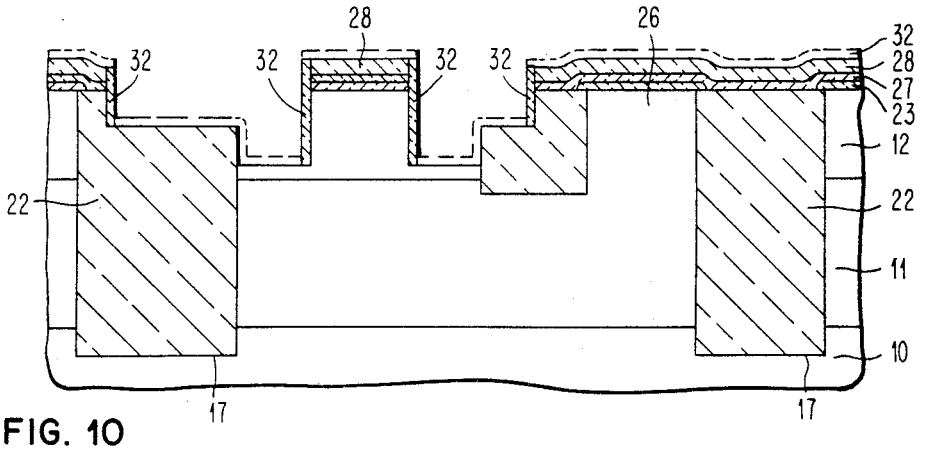
Figure 11:
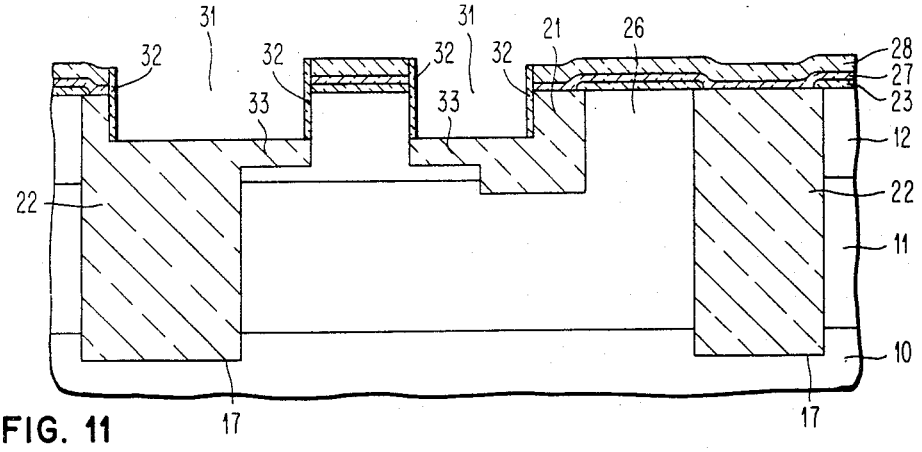
Figure 12:
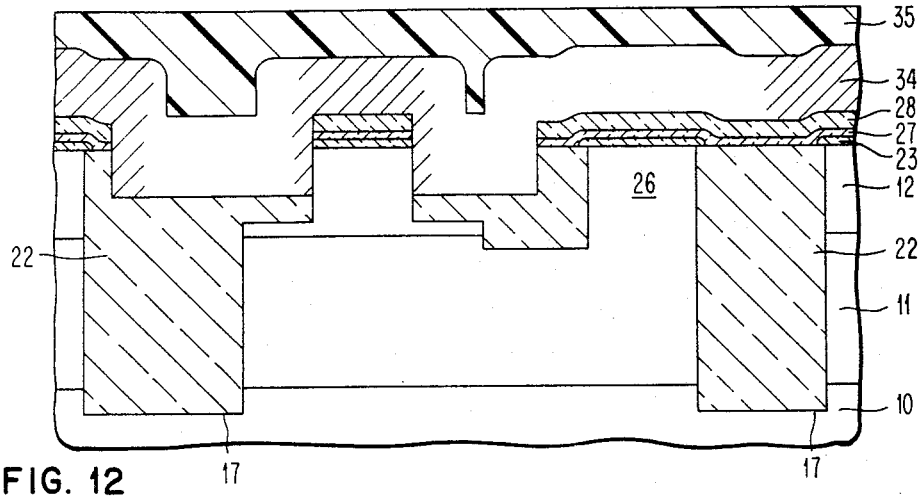
Figure 13:
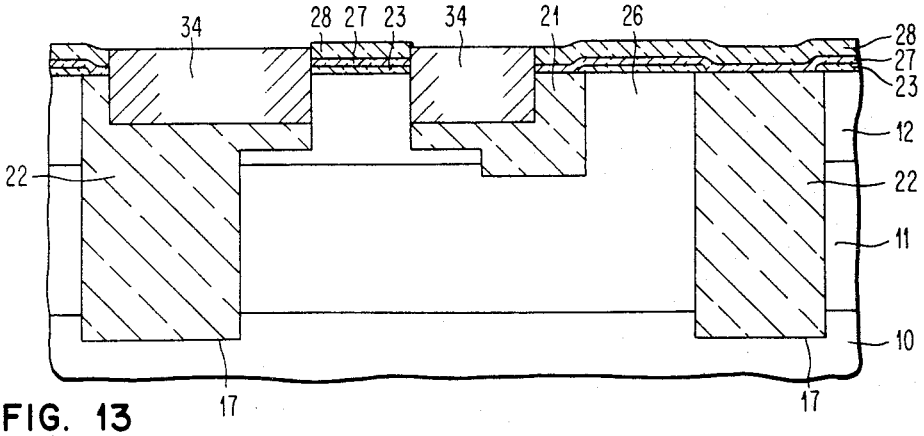
Figure 14:
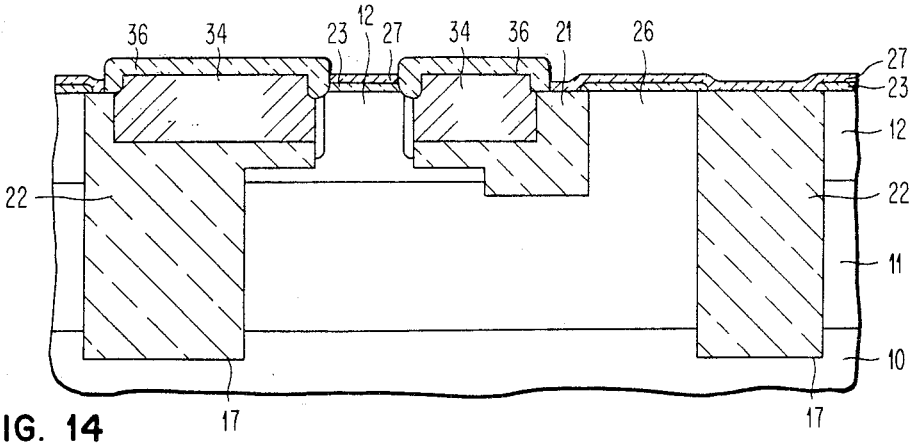
Figure 15:
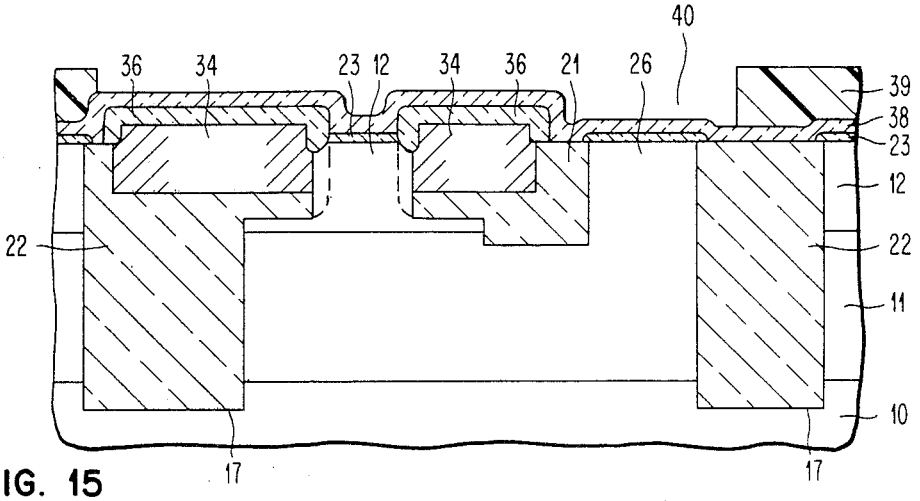
Figure 16:
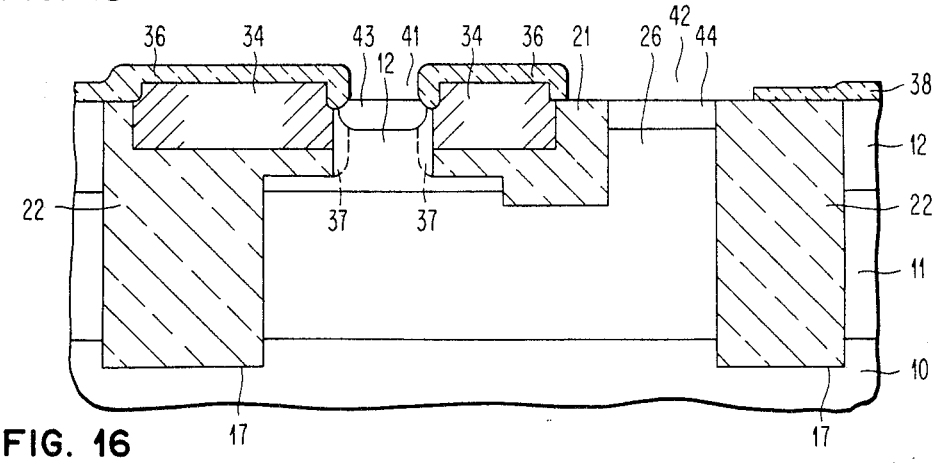
Figure 17:
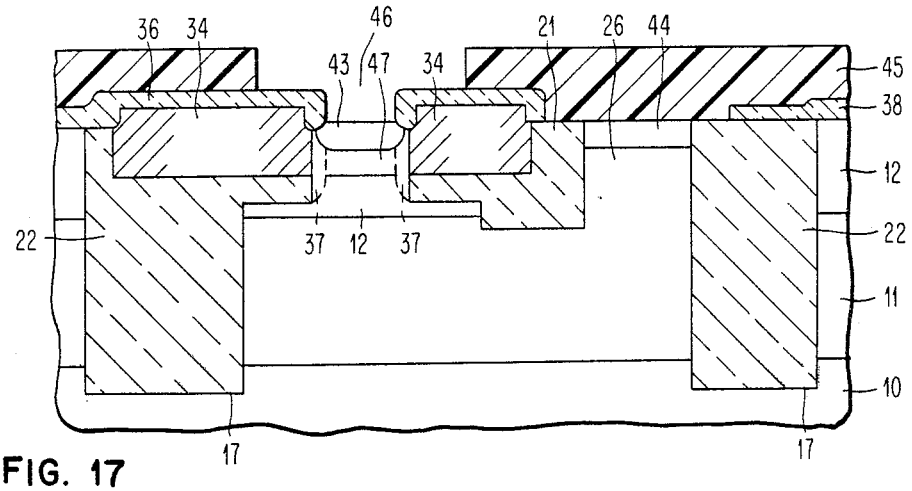
Figure 18:
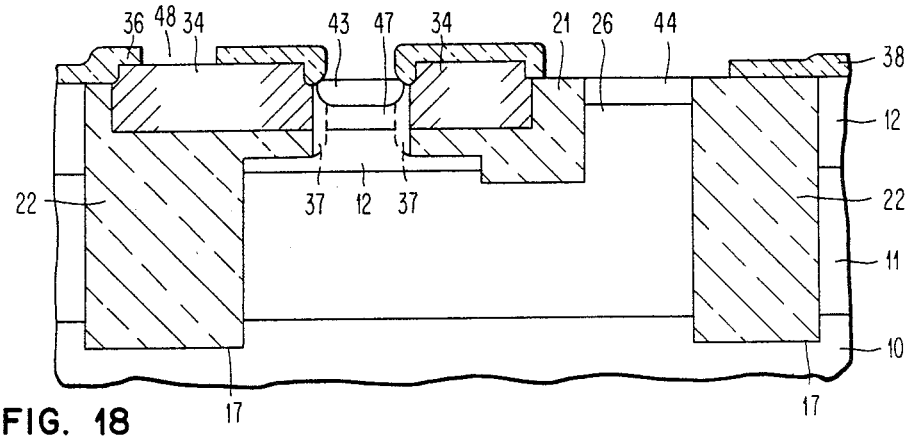
Figure 1B:
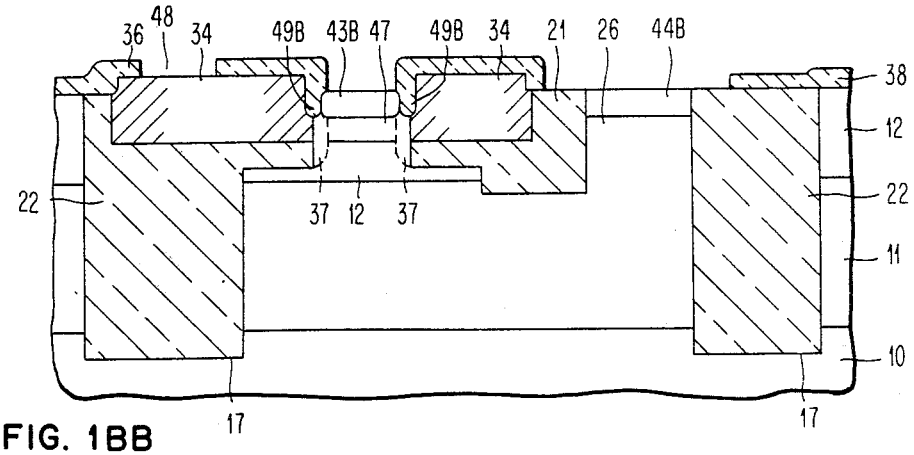

United States Defensive Publication [19] (H) [11] T106,101

Cavaliere et al. [43] Dec. 3, 1985

[54] STRUCTURE OF AN IMPROVED BIPOLAR TRANSISTOR

[76] Inventors: Joseph R. Cavaliere, Bykenhulle Rd., Hopewell Junction, N.Y. 12533; Cheng T. Horng, 6396 Gondola Way, San Jose, Calif. 95120; Richard R. Konian, 49 Brookland Farms Rd., Poughkeepsie, N.Y. 12601; Hans S. Rupprecht, 3505 Kamhi Dr., Yorktown Heights, N.Y. 10598; Robert O. Schwenker, 6359 Gondola Way, San Jose, Calif. 95120

[21] Appl. No.: 695,657

[22] Filed: Jan. 28, 1985

Related U.S. Application Data

[60] Continuation of Ser. No. 310,671, Oct. 13, 1981, abandoned, which is a division of Ser. No. 126,611, Mar. 3, 1980, Pat. No. 4,338,138.

[51] Int. Cl.[4] ..... H01L 29/70

[52] U.S. Cl. ..... 357/34; 357/50; 357/59; 357/49

[57] ABSTRACT

An improved bipolar transistor structure formed in a very small area of a thin epitaxial layer on a planar surface of a silicon substrate of first conductivity type, said very small area of the thin epitaxial layer having vertical sidewalls extending to the planar surface of said substrate, said area of thin epitaxial layer containing in the order recited a shallow depth emitter region of a second conductivity type having an exposed planar surface, a shallow depth base region of said first conductivity type, and a shallow depth active collector region of said second conductivity type, an elongated region of said first conductivity type surrounding said emitter, base and active collector regions, said elongated region being contained within and coextensive with said vertical sidewalls of said small area of said thin epitaxial layer, whereby the base collector capacitance is materially reduced due to the very small area of the base-collector junction.

1 Claim, 8 Sheets Drawing,

38 Pages Specification

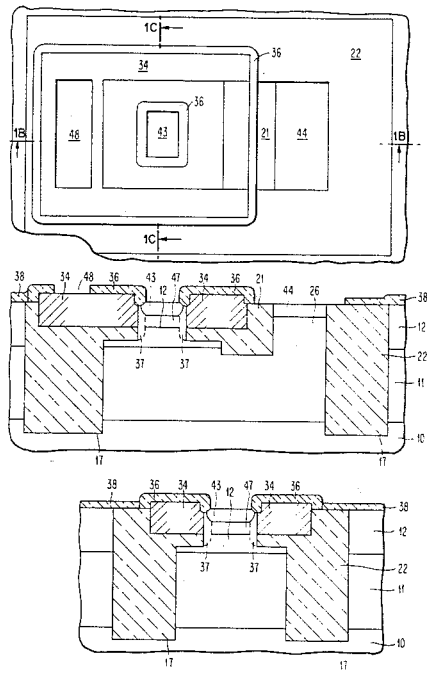

The file of this unexamined application may be inspected and copies thereof may be purchased (849 O.G. 1221, Apr. 9, 1968).